United States Patent
Pong et al.

(10) Patent No.: US 6,232,225 B1
(45) Date of Patent: May 15, 2001

(54) METHOD OF FABRICATING CONTACT WINDOW OF SEMICONDUCTOR DEVICE

(75) Inventors: Chil-kun Pong, Suwon; Joo-hyun Jin, Seoul, both of (KR)

(73) Assignee: Samsung Electronics Co., Ltd., Kyungki-Do (KR)

(*) Notice: Subject to any disclaimer, the term of this patent is extended or adjusted under 35 U.S.C. 154(b) by 0 days.

(21) Appl. No.: 09/275,029

(22) Filed: Mar. 24, 1999

(30) Foreign Application Priority Data

Aug. 12, 1998 (KR) .................................................. 98-32753

(51) Int. Cl.⁷ .................................................. H01L 21/311
(52) U.S. Cl. .......................... 438/640; 438/668; 438/763; 438/783; 438/970; 438/740
(58) Field of Search ..................................... 438/624, 632, 438/640, 763, 783, 970, 740, FOR 493, FOR 489, FOR 196, FOR 400, 666, 668

(56) References Cited

U.S. PATENT DOCUMENTS 5,792,703 * 8/1998 Bronner et al. .

* cited by examiner

Primary Examiner—George Fourson
Assistant Examiner—Barbara E. Abbott
(74) Attorney, Agent, or Firm—The Law Offices of Eugene M. Lee, P.L.L.C.

(57) ABSTRACT

A method of fabricating a contact window of a semiconductor device, whereby a contact window of a semiconductor device is increased to offset any incline phenomenom and avoid unwanted increase in contact sheet resistance, comprises forming a lower conductive member on a semiconductor substrate, forming a first insulative film on the lower conductive member, the first insulative film being formed of an insulative material doped with impurities at a first level of concentration, the first insulative film having a wet etch rate that is proportional to the level of concentration of impurities, forming a second insulative film on the first insulative film, the second insulative film being formed of an insulative material doped with impurities at a second level of concentration that is lower than the first level of concentration of impurities, the second insulative film also having a wet etch rate that is proportional to the level of concentration of impurities, opening a contact window and exposing the lower conductive member by dry etching the second and first insulative films, and wet etching the second and first insulative films through which the contact window has been formed to increase an exposed area of the lower conductive member.

19 Claims, 7 Drawing Sheets

METHOD OF FABRICATING CONTACT WINDOW OF SEMICONDUCTOR DEVICE

BACKGROUND OF THE INVENTION

1. Field of the Invention

The invention relates generally to a method of fabricating a semiconductor device, and more particularly, to a method of fabricating a small contact window having a large aspect ratio.

2. Description of the Related Art

As the level of integration of semiconductor devices increases, it becomes inevitable that the design rule of semiconductor devices is reduced. However, the reduction of the design rule of a device is not made at an identical or exact ratio with respect to all dimensions of the device. For example, the thicknesses of an interlayer insulative layer or a wiring layer involve vertical dimensions that cannot be reduced exactly in proportion to a change in design rule because other factors determining the thickness of each layer must be considered, e.g., breakdown voltage, parasitic capacity, current capacity, wiring resistance, etc. Thus, an aspect ratio is a ratio of the depth of the contact window to the width of the lowest portion of a small contact window.

When the aspect ratio is increased, either a contact window does not become completely formed or an incline phenomenon occurs when etching to form the contact window wherein the width of a bottom portion of a contact window becomes narrower than that of an upper portion of the contact window. When an incline phenomenon occurs, a contact area between the contact window and a lower conductive film is decreased, thereby precipitously increasing sheet resistance.

Particularly, in a capacitor over bit line (COB) structure where a capacitor is formed after forming a bit line, because the aspect ratio of a contact window for contacting a lower electrode of a capacitor with an active region formed on a semiconductor substrate is so large, and the contact area at the lowest portion of the contact window becomes significantly smaller, the sheet resistance is greatly increased.

The present invention is directed to overcoming or at least reducing the effects of one or more of the problems set forth above.

SUMMARY OF THE INVENTION

According to an aspect of the present invention, a method of fabricating a contact window of a semiconductor device, comprises the steps of forming a lower conductive member on a semiconductor substrate; forming a first insulative film on the lower conductive member, the first insulative film being formed of an insulative material doped with impurities at a first level of concentration, the first insulative film having a wet etch rate that is proportional to the level of concentration of impurities; forming a second insulative film on the first insulative film, the second insulative film being formed of an insulative material doped with impurities at a second level of concentration that is lower than the first level of concentration of impurities, the second insulative film also having a wet etch rate that is proportional to the level of concentration of impurities; opening a contact window and exposing the lower conductive member by dry etching the second and first insulative films; and wet etching the second and first insulative films through which the contact window has been formed to increase an exposed area of the lower conductive member.

According to another aspect of the present invention, a method of fabricating a contact window of a semiconductor device, comprises the steps of forming a lower conductive member on a semiconductor substrate; forming an interlayer insulative film on the resulting structure; forming a conductive film pattern on the interlayer insulative film; forming a first insulative film on the entire surface of the resultant structure on which the conductive film pattern is formed, the first insulative film being formed of an insulative material doped with impurities at a first level of concentration; forming a second insulative film on the first insulative film, the second insulative film being formed of an insulative material doped with impurities at a second level of concentration the second insulative film also having a wet etch rate that is proportional to the level of concentration of impurities that is lower than the first level of concentration; opening a contact window and exposing the lower conductive member by dry etching the second and first insulative films; and increasing an exposed area of the lower conductive member by wet etching the second and first insulative films through which the contact window has been formed.

BRIEF DESCRIPTION OF THE DRAWINGS

The above features and advantages of the invention will become apparent upon reference to the following detailed description of specific embodiments and the attached drawings, of which.

DESCRIPTION OF SPECIFIC EMBODIMENTS

Figure 1:
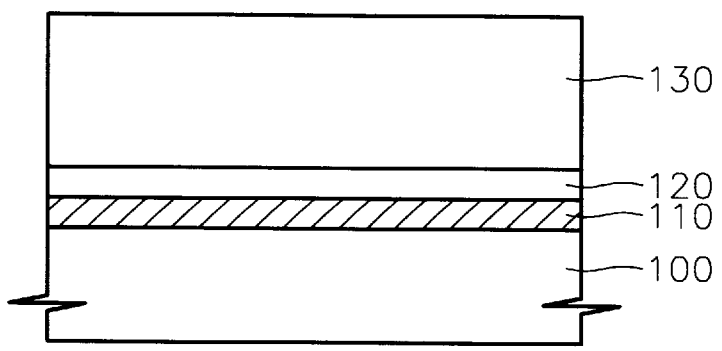
FIGS. 1 through 3 show cross-sections of intermediate structures of a semiconductor device during intermediate fabricating steps of a process for fabricating a contact window, according to an embodiment of the present invention.

Korean Application No. 98-32753, filed Aug. 12, 1998, discloses the same subject matter as the present application and is hereby incorporated by reference as if fully set forth herein.

Hereinafter, a preferred embodiment of the present invention will be described in detail with reference to the attached drawings. However, the present invention is not restricted to the embodiment so described and may be realized in various other forms. The embodiment is provided to more completely explain the present invention to those skilled in the art. In the drawings, the thicknesses of layers or regions are exaggerated for clarity. Also, when it is written that a layer is formed "on" another layer or a substrate, the layer can be formed directly on the other layer or the substrate, or other layers can intervene therebetween. Like reference numerals in the drawings denote the same members.

Referring to FIG. 1, a lower conductive member 110 is formed on a semiconductor substrate 100. The lower conductive member 110 can be an impurity-doped active region, a pad structure, or a lower wiring layer.

A first insulative film 120 is formed on the resultant structure on which the lower conductive member 110 is formed. The first insulative film 120 is formed using an insulative material doped with impurities at a first level of concentration having a characteristic or property in which an etch rate thereof is proportional to the concentration of impurities. An oxide doped with boron or phosphorous is an insulative material having an etch rate, particularly, a wet etch rate, which increases as the concentration of impurities becomes higher. Accordingly, the first insulative film 120 can be formed of borosilicate glass (BSG), phosphosilicate glass (PSG), borophosphosilicate glass (BPSG), etc. It is preferable that, after the first insulative film 120 is deposited, it is planarized by a flow process.

A second insulative film 130 is then formed on the first insulative film 120 and planarized in the same way as in the first insulative film 120. The second insulative film 130 is formed using an insulative material doped with impurities at a second level of concentration that is lower than the first level of concentration of impurities.

Preferably, the first insulative film 120 is formed to a thickness of 1/10 to 1/4 of the thickness of the second insulative film 130.

Figure 2:
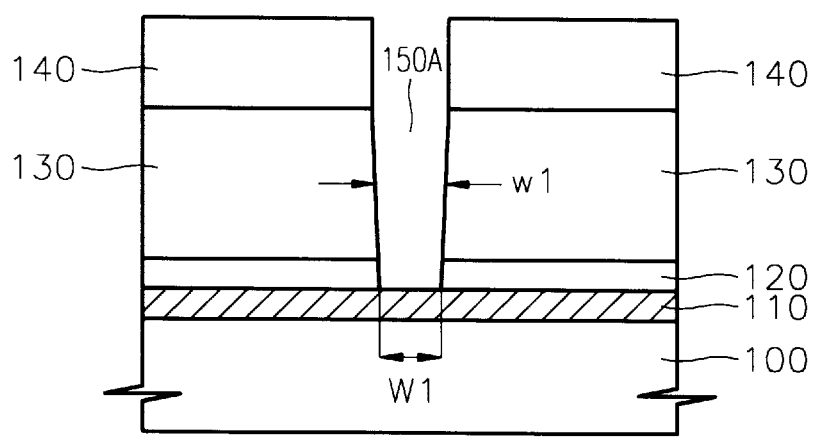

Referring to FIG. 2, a photoresist pattern 140 for defining a small contact window for exposing a part of the conductive member 110 is formed on the second insulative film 130.

A contact window 150A exposing the lower conductive member 110 is formed by dry etching the second and first insulative films 130 and 120, respectively, using the photoresist pattern 140 as an etch mask. Here, the contact window 150A has a lower portion whose width (W1) is smaller than the width (w1) of the center due to an incline phenomenon.

Figure 3:
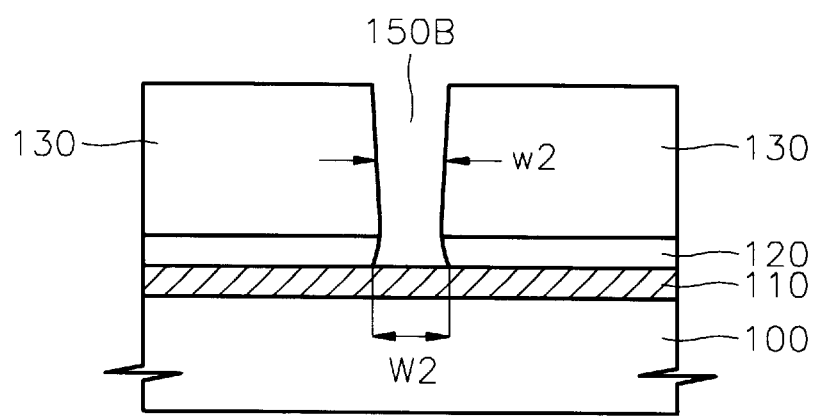

Referring to FIG. 3, a small contact window 150B, having a lower portion whose width (W2) is larger than the width (w2) of the center, is formed by processing the resultant structure of FIG. 2 in a wet etch solution. The width (W2) of the lower portion can be greater than the width (w2) of the center, because the first insulative film 120 having a high impurity concentration has a higher wet etch rate than the second insulative film 130 having a low concentration of impurities. Accordingly, it is preferable that the time for wet etching and the thickness of the first insulative film 120 are controlled by the width (W2) of the lower portion of the contact window to be formed, i.e., an area exposing the lower conductive member 110.

In this way, the width (W2) of the lower portion is increased, thereby enlarging a contact area between the lower conductive member 110 and a conductive material to be filled in the contact window 150B. Thus, an unwanted increase in contact sheet resistance can be prevented.

Figure 4:
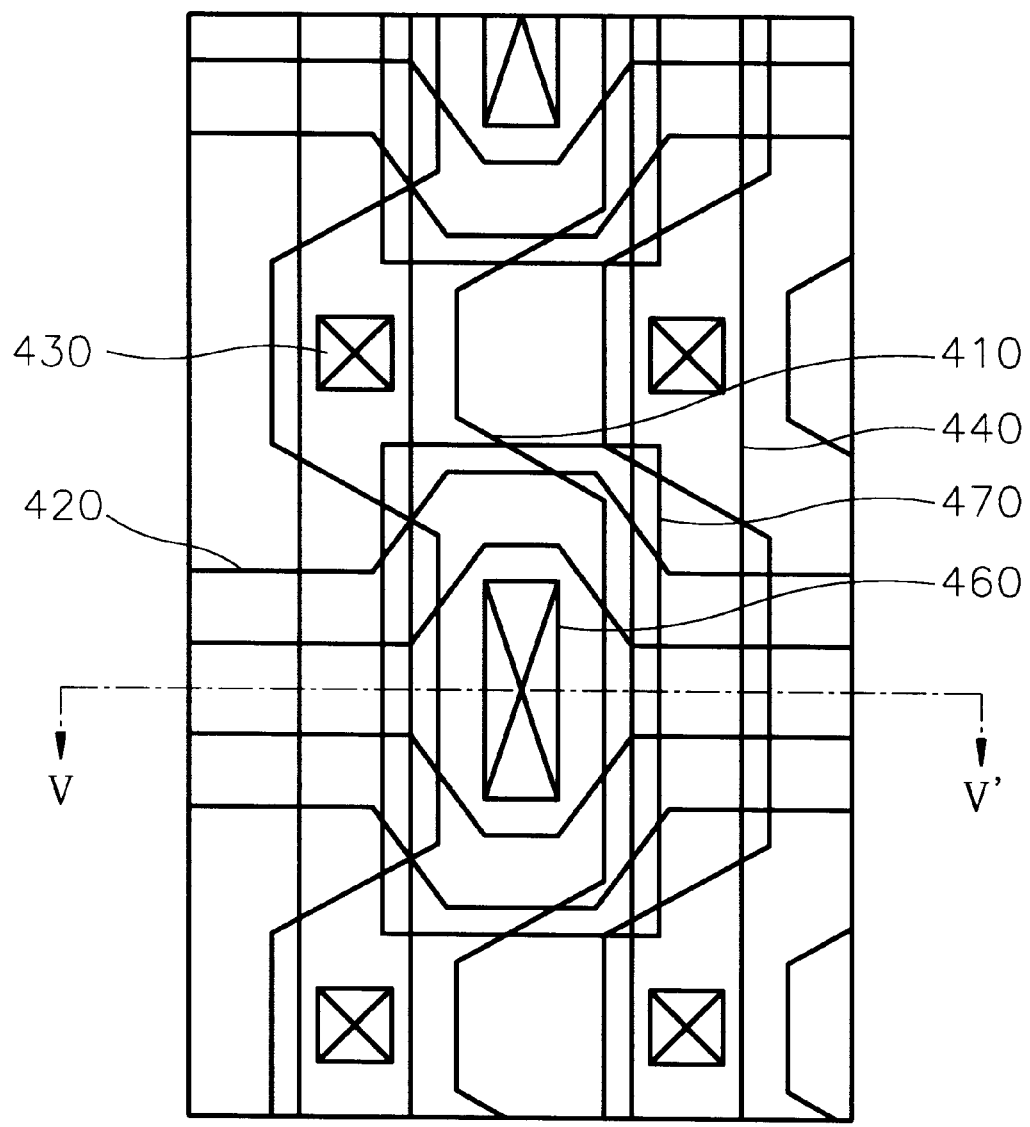
FIG. 4 is a layout view of a DRAM device having a capacitor over bit (COB) line structure, formed by adopting a method of fabricating a contact window according to an embodiment of the present invention.

FIG. 4 is a layout view of a DRAM device having a COB structure, formed by adopting a method of fabricating a contact window according to a preferred embodiment of the present invention.

Referring to FIG. 4, reference numeral 410 represents an active region pattern, reference numeral 420 represents a word line pattern, reference numeral 430 represents a contact window pattern for bit line, reference numeral 440 represents a bit line pattern, reference numeral 460 represents a contact window pattern for storage electrode, and reference numeral 470 represents a storage electrode pattern. Hereinafter, a method of forming a contact window (460 of FIG. 4) for contacting a source region and a storage electrode of a COB structure by adopting a method of fabricating a small contact window according to a preferred embodiment of the present invention will be described referring to FIGS. 5 through 12 showing cross-sections taken along line V–V' of FIG. 4.

Figure 5:
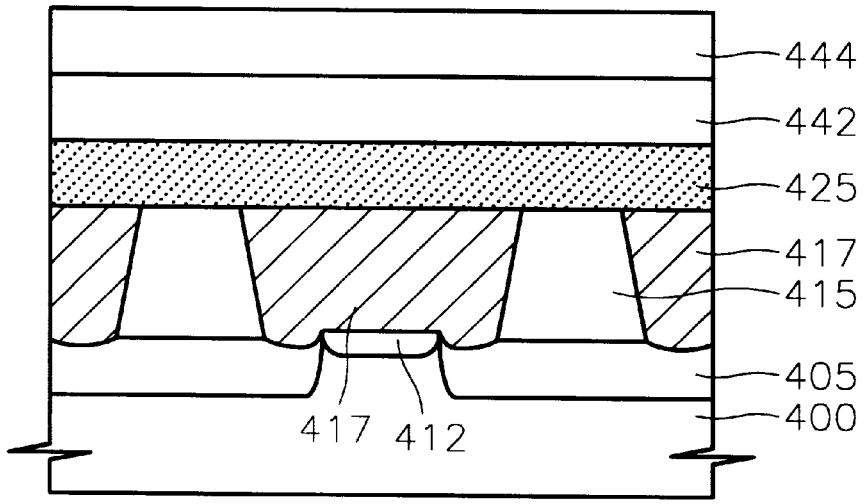
FIGS. 5 through 12 show cross-sections, cut along line V–V' of FIG. 4, of intermediate structures of a semiconductor device during intermediate fabricating steps of a process for forming a storage electrode of a COB structure by adopting a method of fabricating a contact window, according to an embodiment of the present invention.

Referring to FIG. 5, a field oxide film 405 for restricting the semiconductor substrate 400 (shown in FIG. 4) is formed on the semiconductor substrate 400 by using a method such as local oxidation of silicon (LOCOS). A word line pattern 420 (not shown) of FIG. 4 is formed on the active region 410. Impurities are injected onto the entire surface of the substrate to form a conductive region, e.g., a source region 412 and a drain region (not shown). The source region 412 and the drain region can also be formed in a lightly doped drain (LDD) structure, as necessary.

An insulative film, e.g., an oxide film 415, is formed on the entire surface of the resultant structure, and the oxide film 415 is etched, to form a cell pad contact region exposing the source region 412 and the drain region (not shown). The cell pad contact region is filled with a conductive material, thereby forming a cell pad 417. The cell pad 417 is formed on an area where a contact window is to be formed, to reduce the aspect ratio of the contact window. Accordingly, the fabrication step for cell pad 417 may be omitted in consideration of the aspect ratio of the contact window.

An interlayer insulative film 425, e.g., an oxide film, is deposited on the entire surface of the resultant structure on which the cell pad 417 is formed, and the interlayer insulative film 425 is etched, thereby forming a bit line contact window (not shown; refer to reference numeral 430 of FIG. 4) exposing the cell pad 417 formed on the drain region. A polycrystalline silicon film 442 for filling up the bit line contact window is formed on the interlayer insulative film 425. The polycrystalline silicon film 442 is formed to a thickness of between about 1000 Å to about 3000 Å at a temperature range of about 500° C. to about 700° C. by a low pressure chemical vapor deposition (LPCVD). An undoped polycrystalline silicon film is thereby formed, and then is doped with arsenic or phosphorous by ion implantation in order to impart electrical conductivity. Alternatively, an impurity-doped polycrystalline silicon film can be formed by doping impurities in-situ upon deposition. It is preferable that a tungsten silicide film 444 is further formed on the polycrystal silicon film 442 to improve electrical conductivity.

Figure 6:
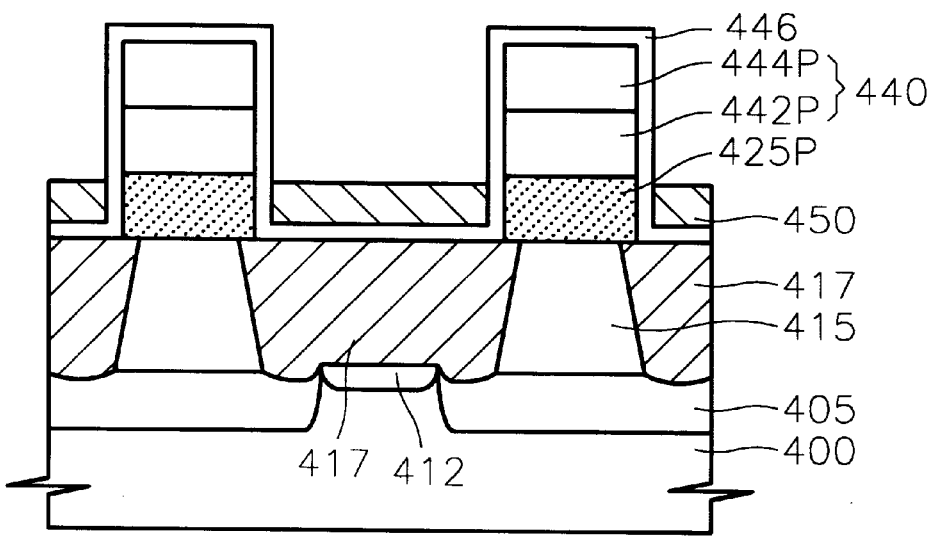

Referring to FIG. 6, the tungsten silicide film 444, the polycrystalline silicon film 442 and the interlayer insulative film 425 are etched, for example, by a reactive ion etching process, thereby forming a bit line 440 comprised of a polycrystalline silicon film pattern 442P and a tungsten silicide film pattern 444P, and an interlayer insulative film pattern 425P below the bit line 440.

An oxidation preventing film 446 is formed on the entire surface of the resultant structure on which the bit line 440 is formed. The oxidation preventing film 446 is formed by depositing a nitride film at a temperature range of about 500° C. to about 850° C. using LPCVD or plasma enhanced chemical vapor deposition (PECVD). The oxidation preventing film 446, for preventing the bit line 440 from being oxidized by the subsequent oxidation such as oxidation of a dielectric film, is formed to a thickness of from about 50 Å to about 500 Å.

Figure 7:
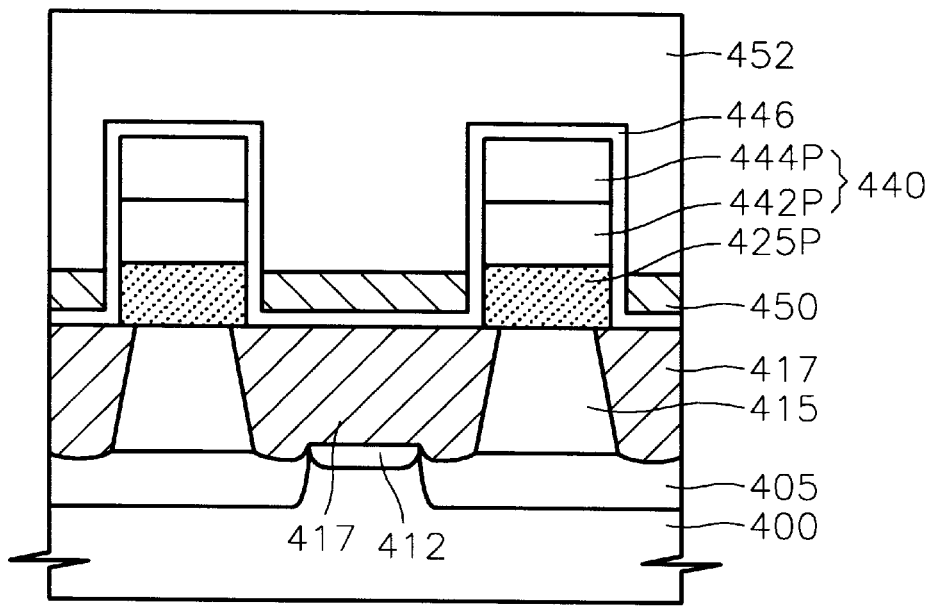

Referring to FIG. 7, a first insulative film 450 is formed on the oxidation preventing film 446. The first insulative film 450 is formed of an insulative material doped with impurities at a first concentration level. As described above, the insulative film forming the first insulative film 450 is a material having a characteristic in which the etch rate, i.e., wet etch rate, thereof is proportional to the concentration of impurities, e.g., an oxide doped with boron or phosphorous. Accordingly, BSG, PSG or BPSG is used. For example, if a first insulative film 450 is formed by depositing BPSG, then a BPSG film is formed to a thickness of between about 300

Å to about 2000 Å using atmospheric pressure chemical vapor deposition (APCVD), LPCVD, or PECVD. Here, the first concentration level is a concentration for doping with boron and phosphorous and is set to be as high as possible in order to render the first insulative film 450 easily flowed and as having a high etch rate during a subsequent wet etching process.

After depositing the insulative material, the deposited insulative material is flowed at a high temperature of between about 750° C. to about 900° C. under a nitrogen atmosphere or a nitrogen/oxygen mix atmosphere. Preferably, the thickness of the first interlayer insulative film 450 formed by the flowing process is less than that of an interlayer insulative film 425 in which the bit line contact holes 430 of FIG. 4 were formed. The reason is to ensure that, after a contact window is formed in the first insulative film 450, even though the first insulative film 450 is excessively etched in the wet etching process to enlarge the lower portion of the contact window, no electrical short exists between the bit line 440 and the contact window occurs.

Referring to FIG. 7, a second insulative film 452 is formed on the entire surface of the resultant structure on which the first insulative film 450 is formed. The second insulative film 452 is formed of an insulative material doped with impurities at a second concentration level that is lower than the first concentration level of impurities of the first insulative film 450.

For example, if the second insulative film 452 is formed by depositing BPSG, then a BPSG film is formed to a thickness of between about 3000 Å to about 9000 Å using APCVD, LPCVD or PECVD. The second insulative film 452 is planarized by a flow process using a typical thermal treatment, an etch back process, or chemical mechanical polishing (CMP).

Figure 8:
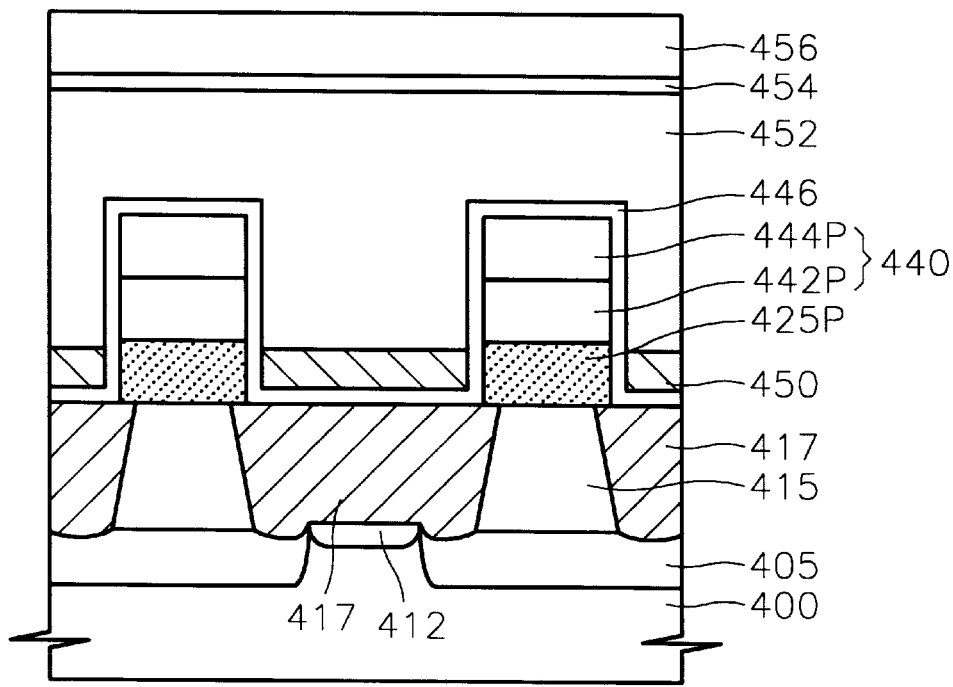

Referring to FIG. 8, an etch stopping film 454 is formed on the planarized second insulative film 452 by depositing a nitride film 454 such as a silicon nitride film ($Si_3N_4$) or silicon oxide nitride film (SION) to a thickness of between about 50 Å and about 500 Å. An third interlayer insulative film 456 for forming an undercut in the lower portion of a storage electrode in the subsequent process is formed. The undercut is formed to increase an effective surface of the storage electrode. The third interlayer insulative film 456 for forming the undercut is formed by depositing an oxide film such as a high temperature oxide film to a thickness of between about 500 Å to about 2000 Å. The etch stopping film 454 prevents the second insulative film 452 from being etched when removing the third interlayer insulative film 456 for forming the undercut, and also prevents the bit line 440 from being oxidized in an oxidation process such as a process for oxidizing a dielectric film.

Accordingly, when the undercut process is not performed or the oxidation prevention film 446 is formed on the bit line, the fabrication steps for the etch stopping film 454 and the third interlayer insulative film 456 for forming the undercut can be omitted.

Figure 9:
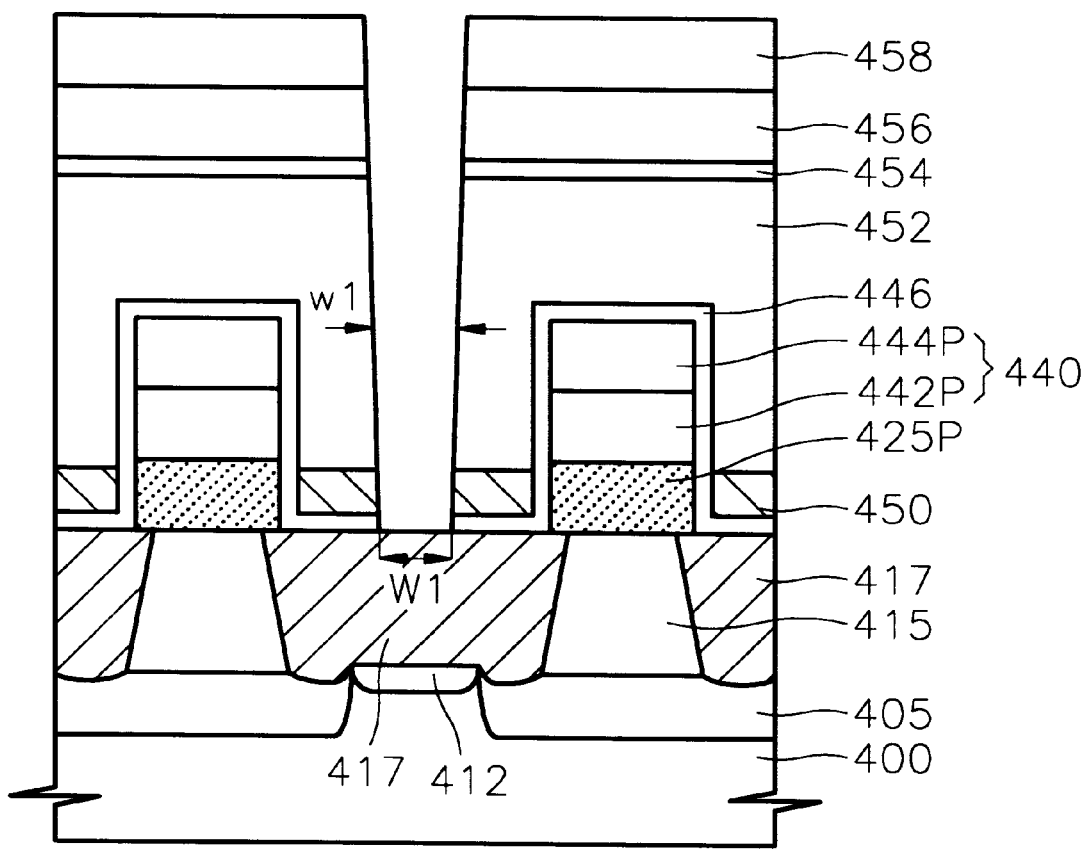

Referring to FIG. 9, a photoresist film is formed on the third interlayer insulative film 456, and then a photoresist pattern 458 for defining a contact window for exposing the cell pad 417 contacting the source region 412 is formed by photo process. The third interlayer insulative film 456, the etch stopping film 454, the second insulative film 452 doped with impurities at the second concentration, the first insulative film 450 doped with impurities at the first concentration higher than the second concentration, and the oxidation preventing film 446 are sequentially etched by a dry etching process such as a reactive ion etching process, using the photoresist pattern 458 as an etch mask, thereby forming a contact window 460A exposing the cell pad 417. Here, since the contact window 460A is formed within the multiple insulative layers 456, 454, 452, and 450, it has a large aspect ratio. Thus, the width (W1) of the lower portion of the contact window 460A is smaller than the width (w1) of the center.

Figure 10:
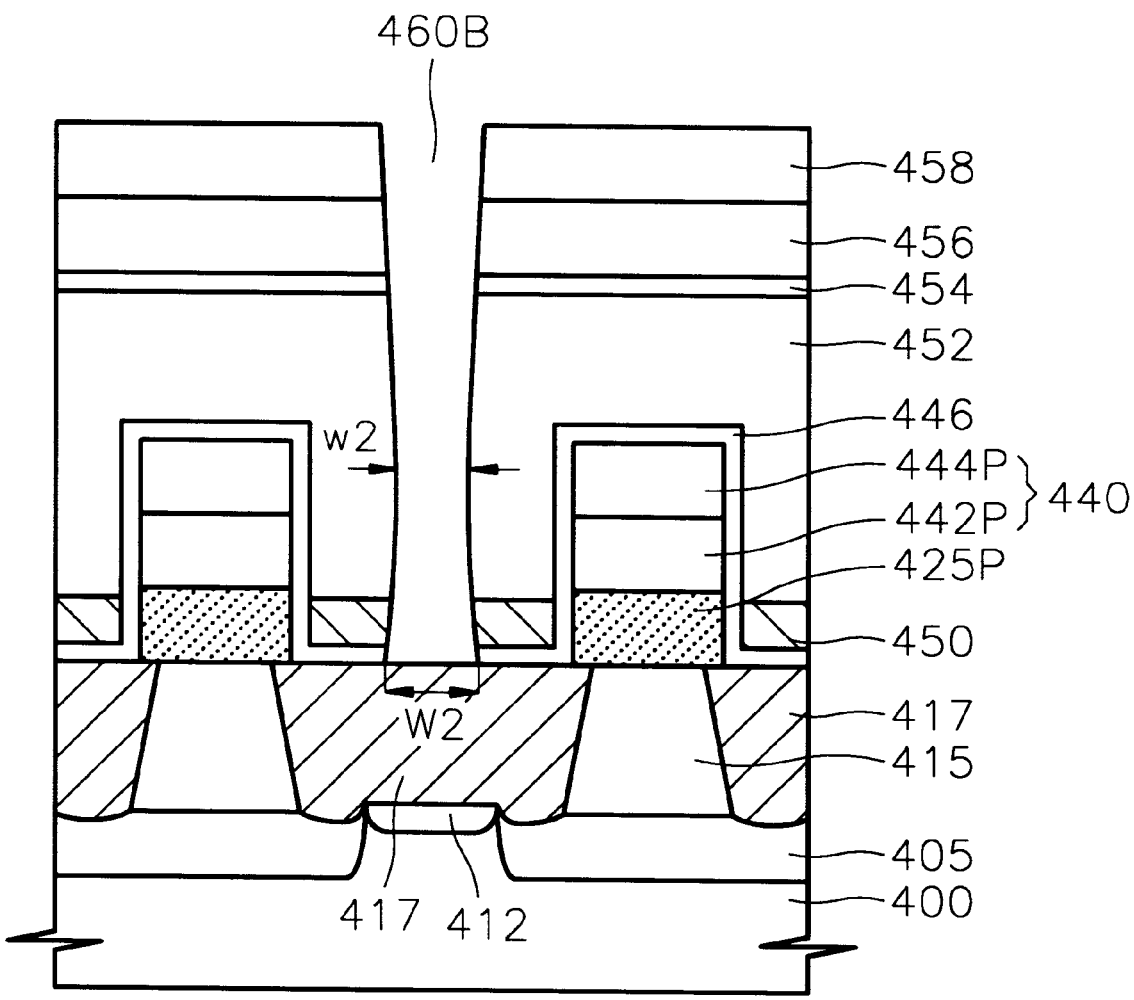

Referring to FIG. 10, the semiconductor substrate 400 on which the contact window 460A (FIG. 9) is formed is wet etched by a mixture solution of ammonium hydroxide ($NH_4OH$), hydrogen peroxide ($H_2O_2$), and deionized water or a hydrofluoric acid solution.

Since the first insulative film 450 is doped with impurities at a higher concentration level than the second insulative film 452, the first interlayer insulative film 450 has a larger wet etch rate than the second interlayer insulative film 452. After a dry etch process for opening the contact window 460A is performed, wet etching is performed, thereby completing a contact window 460B having a lower portion whose width (W2) is larger than the width (w2) of a center portion. That is, a contact area of the contact window 460B which contacts with a lower conductive member, e.g., the cell pad 417 or the source region 412, is enlarged. At this time, the time for wet etching is controlled to prevent an electrical short from occurring between the contact window 460B and the adjacent bit line 440 since the width (W2) of the lower portion of the contact window 460B is substantially enlarged.

The wet etching is used not only to widen the lower portion of the contact window 60B but also to clean the inside surface of the contact window 460B.

Figure 11:
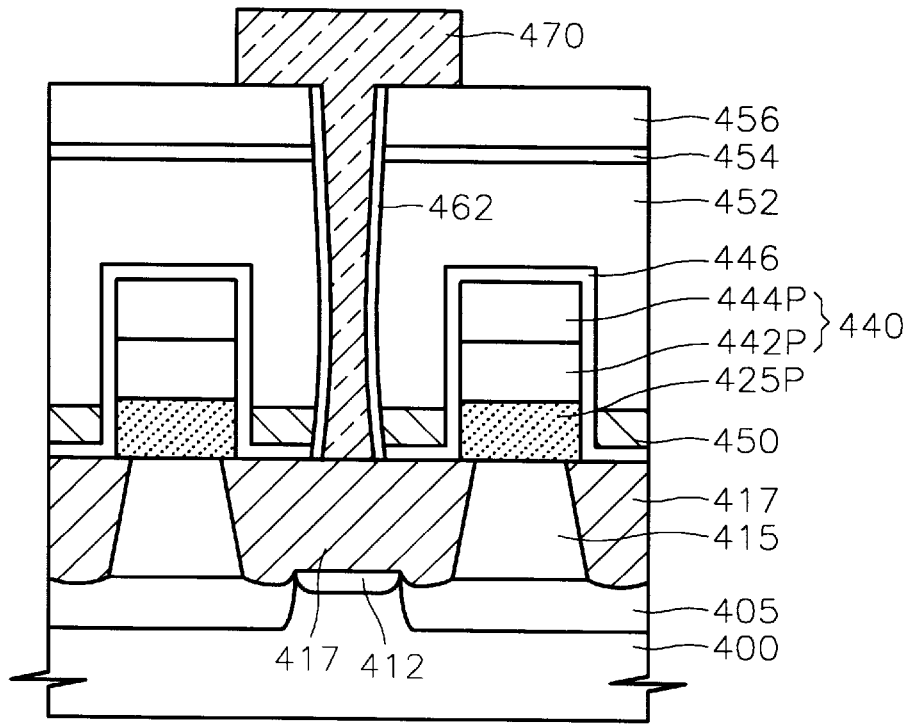

Referring to FIG. 11, the photoresist pattern 458 (FIG. 10) is removed, an insulative film, e.g., a nitride film, is formed to a thickness of between about 100 Å to about 500 Å on the entire surface of the resultant structure on which the contact window 460B is formed, and the insulative film is etched back, thereby forming insulation spacers 462 on the sidewalls of the contact window 460B. A conductive film, e.g., an impurity-doped, polycrystalline silicon film, is formed and fills the contact window 460B and has a predetermined thickness on the oxide film 456. The conductive film is formed to a thickness of between about 5000 Å to about 12000 Å. The conductive film is thereafter patterned to form a storage electrode 470.

Figure 12:
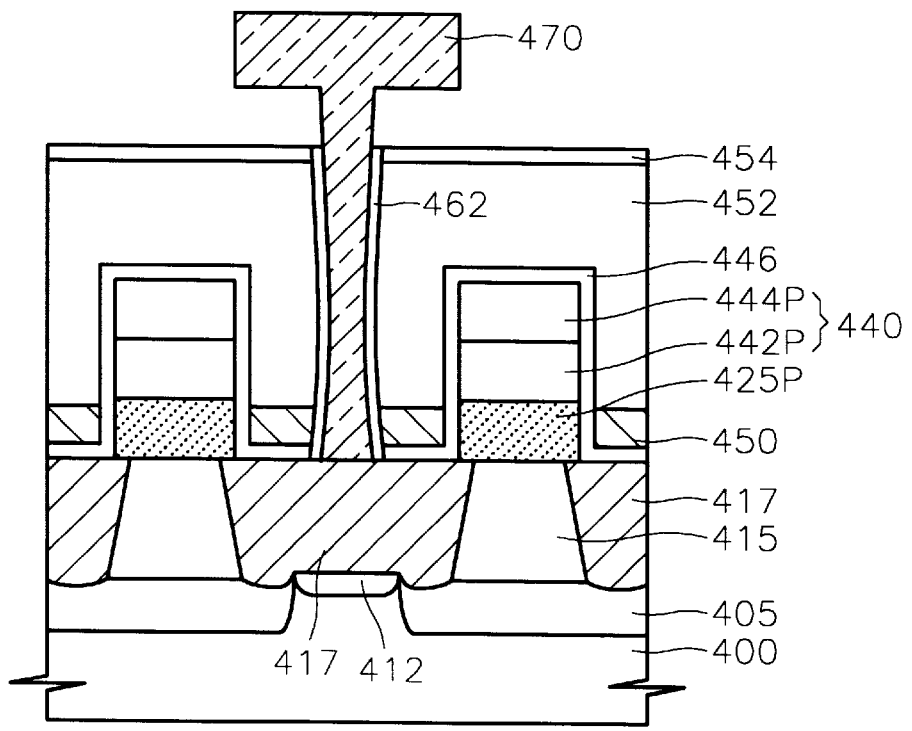

Referring to FIG. 12, the interlayer insulative film 456 (FIG. 11) is selectively removed to form an undercut, thereby completing the formation of the storage electrode structure. The etch stopping film 454 prevents the second insulative film 452 from being damaged.

The storage electrode formed according to a preferred embodiment of the present invention contacts the cell pad 417 via the contact window 460B having a large aspect ratio. However, as opposed to the prior art, the width (W2) of the contact area is large, thus substantially reducing the probability of generating defects of the device due to an increase in contact sheet resistance.

A preferred embodiment of the present invention uses the fact that the wet etch rate of an insulative film doped with impurities at a high concentration is greater than that of an insulative film doped with impurities at a low concentration. Thus, an insulative film comprised of a lower insulative film doped with impurities at high concentration and an upper insulative film doped with impurities at low concentration is dry etched and wet etched, thereby forming a contact window. Consequently, the width of the lower portion of the contact window can be more easily enlarged than a conventional contact window, thus effectively preventing contact sheet resistance from increasing.

In summary, the illustrated embodiments of the present invention provide a method of fabricating a contact window of a semiconductor device, whereby a contact area is widened by enlarging the lower portion of the contact window. This method comprises forming a lower conductive member on a substrate, forming a first insulative film on the lower conductive member, the first insulative film being formed of an insulative material that is doped with impurities at a first level of concentration, forming a second insulative film on the first insulative film, the second insulative film being formed of an insulative material that is doped with impurities at a second level of concentration that is lower than the first level of concentration, opening a contact window by dry etching the second and first insulative films to expose the lower conductive member, and thereafter wet etching the second and first insulative films through which the contact window has been formed to increase an exposed area of the lower conductive member.

Preferably, an interlayer insulative film is formed on the lower conductive film before the first insulative film is formed. A conductive film pattern is further formed on the interlayer insulative film, and the first insulative film is then formed on the conductive film pattern. Here, it is preferable that the first insulative film is formed to have a smaller thickness than the interlayer insulative film.

It is also preferable that the impurities include boron and/or phosphorous and that the insulative material is an oxide doped with impurities. Accordingly, the impurity-doped oxide can be BSG, PSG or BPSG.

According to the illustrated embodiments, an area exposed by a small contact window having a large aspect ratio is enlarged, thereby effectively preventing the contact sheet resistance from increasing.

Thus, a method of making a contact window of a semiconductor device has been described according to a preferred embodiment of the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A method of fabricating a contact window of a semiconductor device, comprising the steps of:
   forming a lower conductive member on a semiconductor substrate;
   forming a first insulative film on the lower conductive member, the first insulative film being formed of an insulative material doped with impurities at a first level of concentration, the first insulative film having a wet etch rate that is proportional to the level of concentration of impurities;
   forming a second insulative film on the first insulative film, the second insulative film being formed of an insulative material doped with impurities at a second level of concentration that is lower than the first level of concentration of impurities, the second insulative film also having a wet etch rate that is proportional to the level of concentration of impurities,
   opening a contact window and exposing the lower conductive member by dry etching the second and first insulative films; and
   wet etching the second and first insulative films through which the contact window has been formed to increase an exposed area of the lower conductive member.

2. The method of fabricating a contact window of a semiconductor device as claimed in claim 1, wherein the impurities include boron and/or phosphorous.

3. The method of fabricating a contact window of a semiconductor device as claimed in claim 2, wherein the insulative material is an oxide doped with impurities.

4. The method of fabricating a contact window of a semiconductor device as claimed in claim 3, wherein the impurity-doped oxide is BSG, PSG or BPSG.

5. The method of fabricating a contact window of a semiconductor device as claimed in claim 1, wherein the first insulative film has a higher wet-etch rate than the second insulative film, such that the wet etching step is for increasing the exposed area of the lower conductive member by making the area of the contact window formed in the first insulative film larger than the area of the contact window formed in the second insulative film.

6. The method of fabricating a contact window of a semiconductor device as claimed in claim 1, wherein the first insulative film is formed to a thickness of from about one tenth to about one fourth of the thickness of the second insulative film.

7. The method of fabricating a contact window of a semiconductor device as claimed in claim 1, wherein the lower conductive member is an impurity-doped region, a pad structure, or a lower wiring layer.

8. The method of fabricating a contact window of a semiconductor device as claimed in claim 1, wherein the first insulative film is first deposited and then planarized by a flow process.

9. A method of fabricating a contact window of a semiconductor device, comprising the steps of:
   forming a lower conductive member on a semiconductor substrate;
   forming an interlayer insulative film on the resulting structure;
   forming a conductive film pattern on the interlayer insulative film;
   forming a first insulative film on the entire surface of the resultant structure on which the conductive film pattern is formed, the first insulative film being formed of an insulative material doped with impurities at a first level of concentration;
   forming a second insulative film on the first insulative film, the second insulative film being formed of an insulative material doped with impurities at a second level of concentration the second insulative film also having a wet etch rate that is proportional to the level of concentration of impurities that is lower than the first level of concentration;
   opening a contact window and exposing the lower conductive member by dry etching the second and first insulative films; and
   increasing an exposed area of the lower conductive member by wet etching the second and first insulative films through which the contact window has been formed.

10. The method of fabricating a contact window of a semiconductor device as claimed in claim 9, wherein the impurities include boron and/or phosphorous.

11. The method of fabricating a contact window of a semiconductor device as claimed in claim 9, wherein the insulative material is an oxide doped with impurities.

12. The method of fabricating a contact window of a semiconductor device as claimed in claim 11, wherein the impurity-doped oxide is BSG, PSG or BPSG.

13. The method of fabricating a contact window of a semiconductor device as claimed in claim 9, wherein the first insulative film has a higher wet-etch rate than the second insulative film such that the wet-etching step is for increasing the exposed area of the lower conductive member by making the area of the contact window formed in the first insulative film larger than the area of the contact window formed in the second insulative film.

14. The method of fabricating a contact window of a semiconductor device as claimed in claim 9, wherein the thickness of the first insulative film is less than the thickness of an interlayer insulative film.

15. The method of fabricating a contact window of a semiconductor device as claimed in claim 9, wherein the first insulative film is formed to a thickness of from about one tenth to about one fourth of the thickness of the second insulative film.

16. The method of fabricating a contact window of a semiconductor device as claimed in claim 9, wherein the lower conductive member is an impurity-doped region, a pad structure, or a lower wiring layer.

17. The method of fabricating a contact window of a semiconductor device as claimed in claim 9, wherein the first insulative film is first deposited and then planarized by a flow process.

18. The method of fabricating a contact window of a semiconductor device as claimed in claim 9, further comprising the step of forming an oxidation prevention film on the entire surface of the conductive film pattern before the step of forming the first insulative film.

19. The method of fabricating a contact window of a semiconductor device as claimed in claim 9, further comprising the step of sequentially forming an etch stopping film and an interlayer insulative film for forming an undercut on a conductive film pattern filling the contact window, on the second insulative film, before the step of opening a contact window, and wherein the contact window opening step is for dry etching the interlayer insulative film for forming the undercut, the etch stopping film, the second insulative film, and the first insulative film.

* * * * *